(12) United States Patent
Wang (10) Patent No.: US 12,096,674 B2
(45) Date of Patent: Sep. 17, 2024

(54) COLOR CONVERSION ASSEMBLY, DISPLAY PANEL AND MANUFACTURING METHOD OF COLOR CONVERSION ASSEMBLY

(71) Applicant: Chengdu Vistar Optoelectronics Co., Ltd., Sichuan (CN)

(72) Inventor: Yan Wang, Chengdu (CN)

(73) Assignee: CHENGDU VISTAR OPTOELECTRONICS CO., LTD., Chengdu (CN)

(*) Notice: Subject to any disclaimer, the term of this patent is extended or adjusted under 35 U.S.C. 154(b) by 710 days.

(21) Appl. No.: 17/323,193

(22) Filed: May 18, 2021

(65) Prior Publication Data

US 2021/0273024 A1    Sep. 2, 2021

Related U.S. Application Data

(63) Continuation of application No. PCT/CN2020/081770, filed on Mar. 27, 2020.

(30) Foreign Application Priority Data

Jul. 11, 2019   (CN) .......................... 201910624305.2

(51) Int. Cl.
*H10K 59/38* (2023.01)
*G02F 1/1335* (2006.01)
(Continued)

(52) U.S. Cl.
CPC ....... *H10K 59/38* (2023.02); *G02F 1/133512* (2013.01); *G02F 1/133514* (2013.01);
(Continued)

(58) Field of Classification Search
CPC ......... G02F 1/133514; G02F 1/133606; G02F 2201/307; G02F 2201/346; H10K 59/38; H10K 59/879
See application file for complete search history.

(56) References Cited

U.S. PATENT DOCUMENTS 10,067,372 B2   9/2018  Tang
10,133,115 B2  11/2018  Cui
(Continued)

FOREIGN PATENT DOCUMENTS

CN    104752620 A    7/2015
CN    104834124 A    8/2015
(Continued)

OTHER PUBLICATIONS

First Office Action and Search Report issued Apr. 27, 2021 in corresponding Chinese Application No. 201910624305.2; 9 pages.
(Continued)

*Primary Examiner* — Jessica M Merlin
(74) *Attorney, Agent, or Firm* — Maier & Maier, PLLC (57) ABSTRACT

A color conversion assembly, a display panel and a manufacturing method for the color conversion assembly. The color conversion assembly includes: a color conversion layer comprising isolation structures, a plurality of accommodating spaces enclosed by the isolation structures, openings in communication with the respective accommodating spaces, and light conversion units arranged in at least some of the accommodating spaces; and a Bragg filter layer comprising curved filters corresponding to the light conversion units. The curved filters are bent in a direction away from the light conversion units.

14 Claims, 6 Drawing Sheets

(51) Int. Cl.
    *G02F 1/13357*      (2006.01)
    *H10K 50/86*      (2023.01)
    *H10K 59/80*      (2023.01)

(52) U.S. Cl.
    CPC ..... *G02F 1/133606* (2013.01); *H10K 50/865* (2023.02); *G02F 2201/346* (2013.01); *H10K 59/879* (2023.02)

(56) References Cited

U.S. PATENT DOCUMENTS

| | | | |
|---|---|---|---|
| 2017/0125748 A1 | | 5/2017 | Choi et al. |
| 2019/0041692 A1 | | 2/2019 | Chen |
| 2019/0165318 A1 | * | 5/2019 | Choi ...................... H10K 59/38 |

FOREIGN PATENT DOCUMENTS

| | | | | | |
|---|---|---|---|---|---|
| CN | 105204222 A | | 12/2015 | | |
| CN | 105223724 A | | 1/2016 | | |
| CN | 205787483 U | | 12/2016 | | |
| CN | 207380280 U | | 5/2018 | | |
| CN | 108169957 A | * | 6/2018 | ........... | G02B 5/0242 |
| CN | 108490678 A | | 9/2018 | | |
| CN | 108573992 A | | 9/2018 | | |
| CN | 108761894 A | | 11/2018 | | |
| KR | 1020170027276 A | | 3/2017 | | |

OTHER PUBLICATIONS

International Search Report issued on Jul. 2, 2020 in corresponding International Application No. PCT/CN2020/081770; 11 pages.

\* cited by examiner

COLOR CONVERSION ASSEMBLY, DISPLAY PANEL AND MANUFACTURING METHOD OF COLOR CONVERSION ASSEMBLY

CROSS REFERENCES TO RELATED APPLICATIONS

The present application is a continuation of International Application No. PCT/CN2020/081770 filed on Mar. 27, 2020, which claims priority from the Chinese patent application No. 201910624305.2, entitled "Color conversion assembly, display panel and manufacturing method of color conversion assembly" and filed on Jul. 11, 2019, both of which are incorporated herein by reference in their entireties.

TECHNICAL FIELD

The present application relates to the technical field of display devices, and particularly relates to a color conversion assembly, a display panel, and a manufacturing method of the color conversion assembly.

BACKGROUND

Flat display devices, such as Liquid Crystal Display (LCD) devices, Organic Light Emitting Diode (OLED) display devices, and display devices using Light Emitting Diode (LED) devices have been widely used in various consumer electronic products, such as mobile phones, TVs, personal digital assistants, digital cameras, notebook computers, and desktop computers, and have become the mainstream of display devices, due to their advantages of high image quality, power saving, thin body and wide application range.

The display device can realize the display of supporting color patterns by a variety of colorization solutions, including realizing colorization by adding a layer of color film on a light-emitting substrate. However, in the solution of using color film for display, light mixing tends to occur between light emitting units, which leads to color deviation related to visual angle.

SUMMARY

The embodiments of the present disclosure provide a color conversion assembly, a display panel, and a manufacturing method of the color conversion assembly.

In one aspect, the embodiments of the present application provide a color conversion assembly, including: a color conversion layer, including an isolation structures, a plurality of accommodating spaces defined by the isolation structures, openings communicating with respective accommodating spaces, and light conversion units disposed in at least some of the accommodating spaces; and a Bragg filter layer, including curved optical filters disposed corresponding to the light conversion units and bending in a direction away from the light conversion units.

The color conversion assembly according to the embodiments of the present application includes a color conversion layer and a Bragg filter layer, the color conversion layer includes an isolation structures and light conversion units, and the isolation structures define accommodating spaces. The curved optical filter is disposed corresponding to the light conversion unit, so that the light emitted from the light conversion unit is directed toward the curved optical filter. The curved optical filter is formed by bending in a direction away from the light conversion unit, which can ensure that the light emitted from the light conversion unit tends to have consistent incident angle when entering the curved optical filter, for example, the incident angle tends to be 90 degrees. Thus, it is ensured that the optical path of the light in the curved optical filter tends to be consistent, thereby improving the filtering effect of the curved optical filter, reducing light leakage and preventing light mixing.

According to the embodiments in one aspect of the present application, the color conversion assembly further includes baffles disposed in the accommodating spaces and corresponding to the light conversion units, each baffle is connected to the isolation structures, each baffle is provided with a light exit hole which penetrates through the baffle, and an exit light passing through the light conversion unit exits through the light exit hole. When the color conversion assembly is applied to a display panel, the baffle, the isolation structures and the driving backplate of the display panel can define a relatively closed space. The light emitted from the light source can be reflected multiple times in the relatively closed space and then enter the light conversion unit, which can increase the light absorptivity and conversion efficiency of the light conversion unit, reduce light leakage, and prevent light mixing. Further, the exit of the light through the light exit hole can reduce the light exit area, which not only can further prevent light mixing, but also can make the incident angle of the light exiting from the light exit hole to the curved optical filter on the inner wall surface of the curved optical filter tends to be consistent, thereby ensuring that the optical path of the light in the curved optical filter tends to be consistent, and thus improving the filtering effect of the curved optical filter, and reducing the light leakage of the light source.

According to any of the above embodiments in one aspect of the present application, a projection of the curved optical filter obtained by projecting the curved optical filter along a direction perpendicular to the paper direction is arc-shaped; thus, it can be further ensured that the light from the light exit hole to the inner wall surface of the curved filter lens tends to have consistent incident angle.

According to any of the above embodiments in one aspect of the present application, the curved optical filter is formed as at least part of a hemisphere, and the center of the hemisphere is located in the light exit hole. The light exit hole is provided to have equal distance to any point on the inner wall surface, which can further ensure that the incident angle of light is consistent, thereby further ensuring that the optical path of the light in the curved optical filter is consistent, and thus improving the filtering effect of the curved optical filter, and reducing leakage of light from the light source.

According to any of the above embodiments in one aspect of the present application, the curved optical filter is formed as a hemisphere. Thus, the curved optical filter can cover the light exit hole completely so as to prevent the light emitted from adjacent two light exit holes from color mixing, and meanwhile, the distances from the light exit hole to all the points of the inner wall surface of the curved optical filter are equal so that the light has equal incident angle, thereby further improving the filtering capability of the curved optical filter.

According to any of the above embodiments in one aspect of the present application, a light blocking member is provided between adjacent two light exit holes, and the light blocking member is connected between the Bragg filter layer and the baffle or between the Bragg filter layer and the isolation structure. By providing the light blocking member, the light emitted from adjacent two light exit holes can be prevented from color mixing.

According to any of the above embodiments in one aspect of the present application, the material of the baffle includes a reflective metal material and/or a light-absorbing material. Thus, the baffle can reflect light, so that the light from the light source can be reflected multiple times in the space, which can improve the absorptivity and conversion efficiency of the light conversion unit with respect to the light source; or, the baffle can absorb light, which can prevent the light from exiting through the baffle.

According to any of the above embodiments in one aspect of the present application, the material of the isolation structure includes a reflective metal material and/or a light-absorbing material, or the isolation structure is provided with a reflective metal layer and/or a light-absorbing layer on its outer surface. Thus, the isolation structure can reflect light or absorb light, and thus the light in adjacent two accommodating spaces can be prevented from mixing.

In another aspect, the embodiments of the present application provide a display panel, including: a driving backplate, wherein a plurality of light sources are distributed on the driving backplate; and the above-mentioned the color conversion assembly, wherein the light sources are disposed corresponding to the accommodating spaces.

In a further aspect, the embodiments of the present application provide a manufacturing method of a color conversion assembly, wherein the method includes steps of:
  providing a substrate;
  forming a model layer on the substrate, and forming a Bragg filter layer in the model layer, wherein the Bragg filter layer includes a plurality of curved optical filters, and the curved optical filters are formed by recessing toward the substrate;
  forming a flattening layer on the model layer;
  forming isolation structures on the flattening layer, wherein the isolation structures define a plurality of accommodating spaces; and
  forming light conversion units in at least some of the accommodating spaces to form the color conversion assembly.

According to the embodiments in the aspect of the present application, before forming the light conversion units in at least some of the accommodating spaces, the method further includes steps of:
  forming baffles in at least some of the accommodating spaces, wherein each baffle is provided with a light exit hole which penetrates through the baffle; and
  forming the light conversion units on the baffles to form the color conversion assembly.

BRIEF DESCRIPTION OF THE DRAWINGS

By reading the following detailed description of the non-limiting embodiments with reference to the accompanying drawings, other features, purposes and advantages of the present application will become more apparent, wherein the same or similar reference signs indicate the same or similar features.

DETAILED DESCRIPTION

The features and exemplary embodiments in various aspects of the present application will be described in detail below. In the following detailed description, many specific details are proposed in order to provide a comprehensive understanding of the present application. However, it is obvious to the person skilled in the art that the present application can be implemented without some of these specific details. The following description of the embodiments is only to provide a better understanding of the present application by showing examples of the present application. In the drawings and the following description, at least part of the well-known structures and technologies are not shown in order to avoid unnecessary blurring of the present application; and, for clarity, the size of some structures may be exaggerated. In addition, the features, structures or characteristics described below may be combined in one or more embodiments in any suitable manner.

In order to better understand the present application, the color conversion assembly, the display panel, and the manufacturing method of the color conversion assembly according to the embodiments of the present application will be described in detail below with reference to FIGS. 1 to 8*i*.

Figure 1:
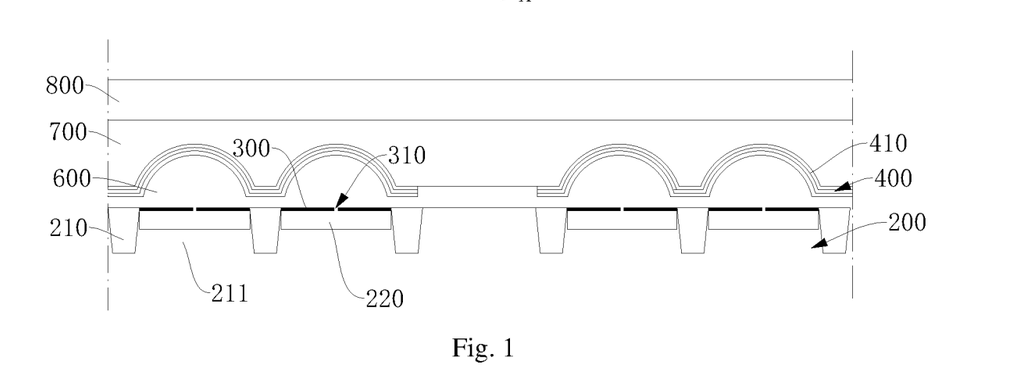
FIG. 1 is a schematic structural diagram of a color conversion assembly according to an embodiment of the present application.

FIG. 1 is a schematic structural diagram of a color conversion assembly provided by embodiments of the present application. The color conversion assembly includes: a color conversion layer 200, including isolation structures 210, accommodating spaces 211 defined by the isolation structures 210, openings communicating with the respective accommodating spaces 211 and light conversion units 220 disposed in at least some of the accommodating spaces 211; and a Bragg filter layer 400, including curved optical filters 410 disposed corresponding to the respective light conversion units 220 and bending in a direction away from the light conversion units 220.

In the color conversion assembly according to the embodiments of the present application, the color conversion assembly includes a color conversion layer 200 and a Bragg filter layer 400. The color conversion layer 200 includes isolation structures 210 and light conversion units 220, and the isolation structures 210 define accommodating spaces 211. The curved optical filters 410 are disposed corresponding to the light conversion units 220, so that the light emitted from the light conversion units 220 is directed toward the curved optical filters 410. Each curved optical filter 410 is formed by bending in a direction away from the light conversion unit 220, which can ensure that the light emitted from the light conversion unit 220 tends to have consistent incident angle when entering the curved optical filter 410, for example, the incident angle tends to be 90 degrees. Thus, it is ensured that the optical path of the light in the curved optical filter 410 tends to be consistent, thereby improving the filtering effect of the curved optical filter 410, reducing light leakage and preventing light mixing.

The isolation structure 210 may be made of a variety of materials. Preferably, the isolation structure 210 is coated with a reflective layer, such as a reflective metal material layer, on its surface, so that the isolation structure 210 can reflect light. The isolation structure 210 not only can prevent the light in adjacent two accommodating spaces 211 from mixing, but also can reflect the light reaching the surface of the isolation structure 210 so as to improve the light absorptivity and conversion efficiency of the light conversion unit 220. Alternatively, the isolation structure 210 is coated with a light-absorbing layer, such as a black light-absorbing material layer, on its surface, so that the isolation structure 210 can prevent the light in adjacent two accommodating spaces 211 from mixing.

In some other optional embodiments, the isolation structure 210 may be made of a reflective metal material or a black light-absorbing material. That is, the material of the isolation structure 210 includes reflective metal material or black light-absorbing material.

The isolation structure 210 may be configured in a variety of shapes. For example, a surface of the isolation structure 210 facing the accommodating space 211 may be a flat plane perpendicular to a driving backplate 100; or, the surface of the isolation structure 210 facing the accommodating space 211 may be an inclined plane, so that the accommodating space 211 gradually increases in size in a direction away from the Bragg filter layer 400, wherein the size of the accommodating space 211 refers to the cross-sectional area of the accommodating space 211 in a direction parallel to the light conversion unit 220 (X direction as shown in FIG. 1). In the case that the isolation structure 210 is made of the reflective material, the inclined plane of the isolation structure 210 facing the accommodating space 211 can increase the light reflection efficiency of the isolation structure 210 and thus further improve the light absorptivity and conversion efficiency of the light conversion unit 220.

The light conversion unit 220 may be configured in a variety of manners. For example, in the case that the color conversion assembly is applied to a display panel and the light source 110 of the display panel is a blue light source, the light conversion unit 220 includes a red conversion unit and a green conversion unit. In the case that the light source 110 of the display panel emits other kinds of lights, such as UV light, the light conversion unit 220 includes a red conversion unit, a green conversion unit, and a blue conversion unit.

The light conversion unit 220 may be configured in a variety of manners. For example, the light conversion unit 220 may contain red quantum dot material or green quantum dot material, so that the light conversion unit 220 can emit a red light or green light corresponding to sub-pixel under the excitation of the light emitted by the light source 110.

The configuration of the color conversion assembly is not limited to the above embodiments. In some optional embodiments, the color conversion assembly further includes baffles 300, disposed in the accommodating spaces and corresponding to the light conversion units 220, and each baffle 300 is connected to the isolation structures 210 to define a reflection space between the baffle 300 and an inner wall surface of the curved optical filter 410 facing the baffle 300. Each baffle 300 is provided with a light exit hole 310 which penetrates through the baffle 300, so that the light emitted from the light source 110 can pass through the light conversion unit 220 and exit through the light exit hole 310.

Figure 6:
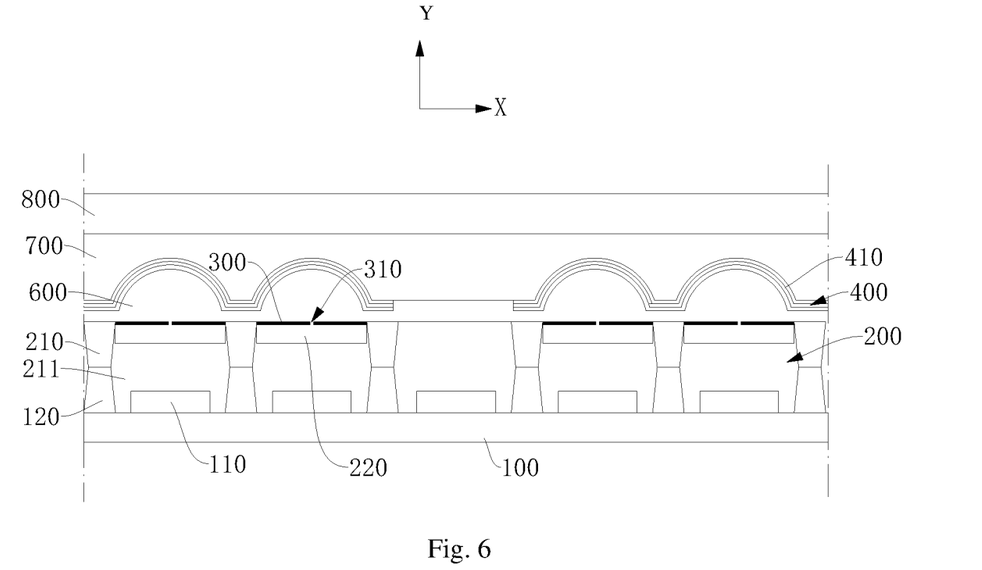
FIG. 6 is a schematic structural diagram of a display panel according to an embodiment of the present application.

In these optional embodiments, when the color conversion assembly is applied to a display panel (as shown in FIG. 6), the baffle 300, the isolation structures 210 and the driving backplate 100 of the display panel can define a relatively closed space. The light emitted from the light source 110 can be reflected multiple times in the relatively closed space and then enter the light conversion unit 220, which can increase the light absorptivity and conversion efficiency of the light conversion unit 220, reduce light leakage, and prevent light mixing. Further, the exit of the light through the light exit hole 310 can reduce the light exit area, which not only can further prevent light mixing, but also can make the incident angle of the light exiting from the light exit hole 310 to the curved optical filter 410 on the inner wall surface of the curved optical filter 410 tends to be consistent, thereby ensuring that the optical path of the light in the curved optical filter 410 tends to be consistent, and thus improving the filtering effect of the curved optical filter 410, and reducing the light leakage of the light source 110.

The baffle 300 can be configured in variety of manners. For example, the baffle 300 is made of at least one of a reflective metal material and a light-absorbing material. That is, the material of the baffle 300 includes at least one of the reflective metal material and the light-absorbing material. Preferably, the baffle 300 is made of the reflective metal material, that is, the baffle 300 is formed as a metal reflective layer, so that the baffle 300 can reflect light, and the light emitted from the light source 110 can be reflected multiple times in the space 211, thereby improving the absorptivity and conversion efficiency of the light conversion unit 220 for light source 110. In the case that the material of the baffle 300 includes the light-absorbing material, the baffle 300 can absorb the light emitted from the light source 110, thereby preventing the light from exiting from the baffle 300.

The shape and size of the light exit hole 310 on the baffle 300 are not limited, as long as the light exit hole 310 has a reduced light exit area and can form a point lighting with respect to the curved optical filter 410.

The Bragg filter layer 400 may be configured in variety of manners. For example, the Bragg filter layer 400 is formed by alternately stacking films with different refractive indices, so that light of a specific wavelength band can be reflected back to the reflection space when passing through the Bragg filter layer 400, to achieve the purpose of filtering. Preferably, the Bragg filter layer 400 is formed by alternately stacking two kinds of film layers with different refractive indices, so that light of a specific wavelength band can be reflected back to the reflection space when passing through the Bragg filter layer 400. The films may be configured in variety of manners, for example, the films can be made by chemical vapor deposition. For example, the Bragg filter layer 400 is made by alternately growing transparent inorganic material films, such as silicon dioxide $SiO_2$, silicon nitride $Si_3N_4$, with different refractive indices, by use of chemical vapor deposition; or, the Bragg filter layer 400 is made by alternately growing organic material films, such as Parylene films, with different refractive indices by use of chemical vapor deposition. The film can also be made by a solution method, for example, a Polymethylmethacrylate (PMMA) film made by the solution method. The light of a specific wavelength band is, for example, blue light. In the case that the color conversion assembly is applied to the display panel and the light source 110 of the display panel is blue light source 110, the blue light can be reflected back to the reflection space when it reaches the Bragg filter layer 400.

The shape of the curved optical filter 410 is not limited here. Preferably, the projection of the curved optical filter 410 obtained by projecting the curved optical filter 410 along a direction perpendicular to the paper direction in FIG. 1, is arc-shaped, which can further ensure that the light from the light exit hole 310 to the inner wall surface of the curved optical filter 410 tends to have consistent incident angle. That is, the curved optical filter 410 has an arc-shaped curved surface. Herein, the paper direction, that is, Y direction as shown in FIG. 1 is the thickness direction of the color conversion assembly, and FIG. 1 shows the cross section of the color conversion assembly along the thickness direction. As can be seen from FIG. 1, the curved optical filter 410 is arc-shaped in the cross section of the Bragg filter layer 400 along the thickness direction.

Further preferably, the curved optical filter 410 is formed as at least part of a hemisphere, and the center of the hemisphere which the curved optical filter 410 is part of, is located in the light exit hole 310. That is, the curved optical filter 410 is a spherical lens. The light exit hole 310 is provided to have equal distance to any point on the inner wall surface, which can further ensure that the incident angle of light is consistent. Further, the light emitted from the light exit hole 310 is provided to be perpendicular to the inner wall surface of the curved optical filter 410, thereby further ensuring that the optical path of the light in the curved optical filter 410 is consistent, improving the filtering effect of the curved optical filter 410, and reducing leakage of light from the light source 110.

The curved optical filter 410 is formed as a hemisphere or at least part of a hemisphere. The sphere here is not a strict sphere in the mathematical and geometrical sense, as long as the curved optical filter 410 is roughly a hemisphere or part of a hemisphere within an allowable error range. The center of the hemisphere which the curved filter 410 is part of, being located in the light exit hole 310 means that: in the plane where the baffle 300 is located, the center of the hemisphere which the curved optical filter 410 is part of, is located in the light exit hole 310, or in a thickness direction of the baffle 300, the center of the hemisphere which the curved optical filter 410 is part of, is located in the light exit hole 310.

Figure 2:
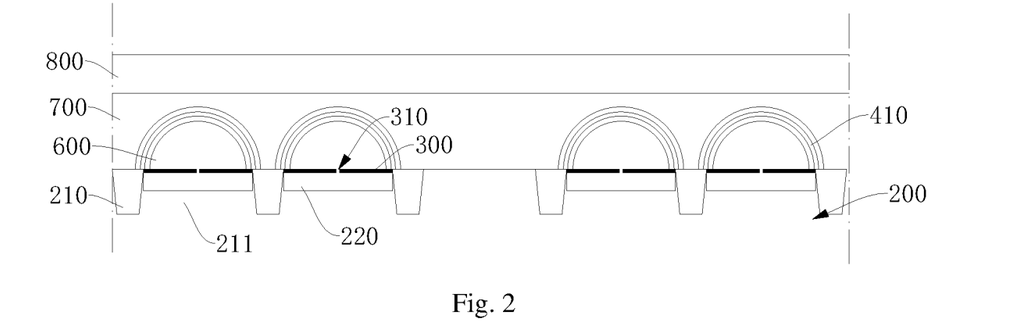
FIG. 2 is a schematic structural diagram of a color conversion assembly of FIG. 1 with the curved optical filter in a hemispherical shape.

As shown in FIG. 2, in some other optional embodiments, the curved optical filter 410 is formed in a hemispherical shape, and the center of the curved optical filter 410 is located in the light exit hole 310. The curved optical filter 410 can cover the light exit hole 310 completely so as to prevent the light emitted from adjacent two light exit holes 310 from color mixing, and meanwhile, the distances from the light exit hole 310 to all the points of the inner wall surface of the curved optical filter 410 are equal so that the light has equal incident angle, thereby further improving the filtering capability of the curved optical filter 410.

Figure 3:
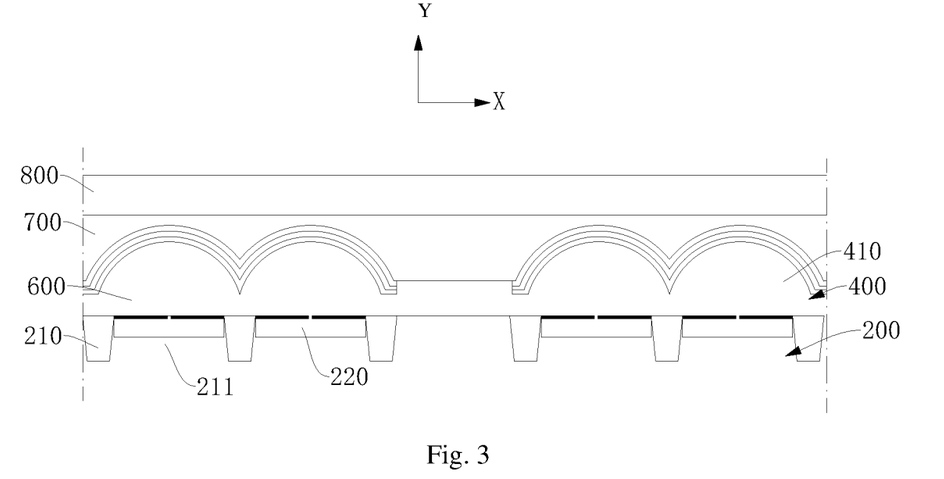
FIG. 3 is a schematic structural diagram of a color conversion assembly of FIG. 1 with the curved optical filter being part of hemisphere and with adjacent two curved optical filters intersecting with each other.
Figure 4:
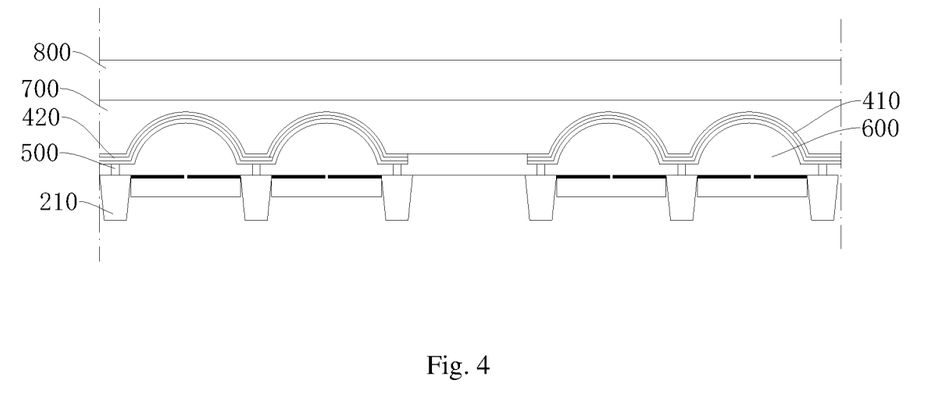
FIG. 4 is a schematic structural diagram of a color conversion assembly of FIG. 1 added with blocking members.
Figure 5:
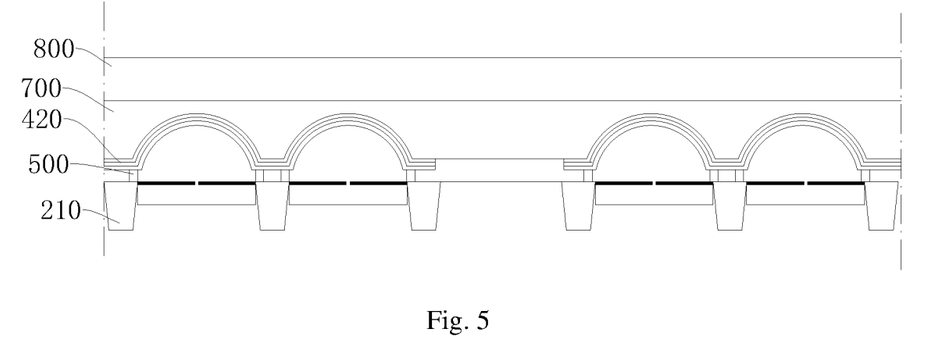
FIG. 5 is a schematic structural diagram of a color conversion assembly of FIG. 1 added with the blocking members.

As shown in FIGS. 3 to 5, in some other optional embodiments, the curved optical filter 410 is a part of a hemisphere, the curved optical filter 410 and the baffle 300 are spaced apart in a thickness direction of the color conversion assembly, and a light blocking member 500 is provided between adjacent two light exit holes 310, wherein the light blocking member 500 is connected between the Bragg filter layer 400 and the baffle 300 or between the Bragg filter layer 400 and the isolation structure 210.

In these optional embodiments, the curved optical filter 410 cannot completely cover the light exit hole 310, and thus the light blocking member 500 is provided. By providing the light blocking member 500, the light emitted from adjacent two light exit holes 310 can be prevented from color mixing.

The configuration of the Bragg filter layer 400 is not limited to this, and for example, in some optional embodiments, as shown in FIG. 3, adjacent two curved optical filters 410 intersect, or in some other optional embodiments, as shown in FIGS. 4 and 5, the Bragg filter layer 400 further includes a flat portion 420 for connecting adjacent two curved optical filters 410, and the light blocking member 500 may be connected between the flat portion 420 and the baffle 300 or between the flat portion 420 and the isolation structure 210. As shown in FIG. 4, one light blocking member 500 is provided between adjacent two curved optional filters 410, the light blocking member 500 is located in the middle position between the adjacent two curved optional filters 410, and thus the light blocking member 500 is connected between the isolation structure 210 and the flat portion 420. Alternatively, as shown in FIG. 5, two light blocking members 500 may be provided between adjacent two curved optical filters 410, wherein an intersection point is formed between the curved optical filter 410 and the flat portion 420, and the light blocking member 500 is connected between position near the intersection point and the baffle 300 or between position near the intersection point and the isolation structure 210, to further ensure that the light emitted from the light exit hole 310 to the inner wall surface of the curved optical filter 410 has consistent optical path.

Considering that when the Bragg filter layer 400 includes the curved optical filters 410, the color mixing of the light from adjacent two light exit holes 310 is very limited, in order to simplify the process of the color conversion assembly, as shown in FIG. 1, the light blocking members 500 may not be provided.

In order to form the curved optical filter 410 and ensure the flatness of a surface of the Bragg filter layer 400 close to the color conversion layer 200, the color conversion assembly further includes a model layer 700 and a flattening layer 600, wherein the model layer 700 is provided with recesses 710 fitted with the curved optical filters 410 in shape, and the reflective material is allowed to be deposited in the recesses 710 to form the Bragg filter layer 400, and meanwhile, the model layer 700 is provided with the flattening layer 600 on a side close to the color conversion layer 200, wherein the flattening layer 600 can fill the voids of the curved optical filters 410, and thus the flatness of the surface of the Bragg filter layer 400 close to the color conversion layer 200 can be ensured. When the curved optical filters 410 are spherical and completely cover the light exit holes 310, the flattening layer 600 fills the curved optical filters 410; when the curved optical filters 410 and the color conversion layer 200 are spaced apart, the flattening layer 600 further fills the gap between the curved optical filters 410 and the color conversion layer 200. Further, a glass cover plate 800 is provided on a side of the model layer 700 away from the flattening layer 600 to form a packaging protection layer.

Further referring to FIG. 6 together, the second embodiment of the present application provides a display panel including the above-mentioned color conversion assembly. Since the display panel according to the embodiments of the present application includes the above-mentioned color conversion assembly, the display panel according to the embodiments of the present application has the beneficial effects of the above-mentioned color conversion assembly, which will not be repeated here.

The display panel according to the embodiments of the present application may be a Liquid Crystal Display (LCD) display panel, an Organic Light Emitting Display (OLED) display panel, and a display panel using Light Emitting Diode (LED) devices.

Optionally, the display panel further includes a driving backplate 100, and a plurality of light sources 110 are distributed on the driving backplate 100. The light sources 110 are disposed corresponding to the respective accommodating spaces 211.

Further, the driving backplate 100 is provided with light shielding structures 120, the light shielding structures 120 define receiving cavities, and the light sources 110 are disposed in the respective receiving cavities. When the display panel includes the color conversion assembly and the driving backplate 100, the light shielding structures 120 and the isolation structures 210 are aligned and attached to each other to form relatively closed spaces, which further improves the effect of preventing light leakage.

The light source 110 may be configured in variety of manners. The light source 110 may be a light source 110 of various colors, for example, the light source 110 is a white light source 110, a blue light source 110, and so on.

The relative positions of the light source 110 and the light exit hole 310 are not limited. Preferably, the light source 110 and the light exit hole 310 are disposed correspondingly in a thickness direction of the display panel (Y direction in FIG. 6). Further preferably, along the thickness direction, the projection of the light source 110 on the driving backplate 100 and the projection of the light exit hole 310 on the driving backplate 100 are at least partially overlapped, to ensure that the light emitted from the light source 110 enters the light conversion unit 220 as much as possible, thereby improving the absorptivity and conversion efficiency of the light conversion unit 220.

The third embodiment of the present application provides a display device including the above-mentioned display panel. The display device according to the embodiments of the present application may be a device with display function, including but not limited to, a mobile phone, a Personal Digital Assistant (PDA for short), a tablet computer, an electronic book, a television, an access control, a smart fixed phone, a console, and so on. Since the display device according to the embodiments of the present application includes the above-mentioned display panel, the display device according to the embodiments has the beneficial effects of the above-mentioned display panel, which will not be repeated here.

Figure 7:
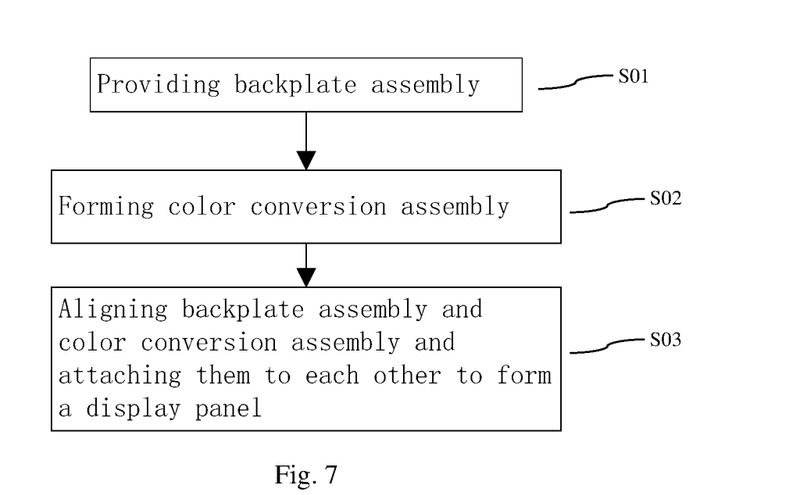
FIG. 7 is a manufacturing flow chart of a display panel according to an embodiment of the present application.

Further referring to FIG. 7 together, a fourth embodiment of the present application provides a manufacturing method of a display panel, including:

Step S01: providing a backplate assembly.

The backplate assembly includes a driving backplate 100, a plurality of light sources 110 distributed on the driving backplate 100, and light shielding structures 120 surrounding the light sources 110.

Step S02: forming a color conversion assembly.

The color conversion assembly includes a substrate, a Bragg filter layer 400 disposed on the substrate and a color conversion layer 200, wherein the Bragg filter layer 400 includes a plurality of curved optical filters 410, which are formed by recessing toward the substrate, and the color conversion layer 200 includes isolation structures 210, accommodating spaces 211 defined by the isolation structures 210 and light conversion units 220 disposed in at least some of the accommodating spaces 211.

Step S03: aligning the backplate assembly and the color conversion assembly and attaching them to each other to form a display panel.

The sequence of step S02 and step S01 is not limited. Either one of the backplate assembly and the color conversion assembly may be formed at first, as long as the backplate assembly and the color conversion assembly can be aligned and attached to each other to form the display panel.

The color conversion assembly may be formed by a variety of methods, that is, the Step S02 may be performed in a variety of manners. In some optional embodiments, the Step S02 includes:

Step S021: providing a substrate, forming a model layer on the substrate, and forming a Bragg filter layer in the model layer, wherein the Bragg filter layer includes a plurality of curved optical filters, which are formed by recessing toward the substrate.

The model layer 700 can be made of plastic transparent materials, such as photoresist, resin, and polydimethylsiloxane. The model layer 700 can be formed by a mold nano-imprint method.

Step S022: forming a flattening layer on the model layer.

The flattening layer 600 can be made of transparent flattening layer materials, such as photoresist and packaging glue, and the flattening layer 600 can be formed by printing, spraying, spin coating, and other methods.

Step S023: forming the isolation structures on the flattening layer, and the isolation structures define a plurality of accommodating spaces.

In the Step S023, at least some of the accommodating spaces 211 are disposed corresponding to the curved optical filters 410.

Step S024: disposing light conversion units in at least some of the accommodating spaces to form a color conversion assembly.

In this case, in the Step S03, when the backplate assembly and the color conversion assembly are aligned and attached to each other, the light shielding structures 120 and the isolation structures 210 are abutted against each other to form relatively closed spaces, the light sources 110 are disposed in the closed spaces, and the light conversion units 220 are located in at least some of the closed spaces.

The Step S024 may be performed in a variety of manners. For example, the Step S024 further includes:

Step S024a: forming baffles in at least some of the accommodating spaces, wherein each baffle is provided with a light exiting hole which penetrates through the baffle.

In the Step S024a, the baffles 300 are disposed corresponding to the curved optical filters 410.

Step S024b: forming the light conversion units on the baffles so as to form the color conversion assembly.

Further referring to FIG. 8a to FIG. 8i together and taking the display panel of FIG. 6 as an example, the forming process of the display panel is briefly described.

Figure 8A:
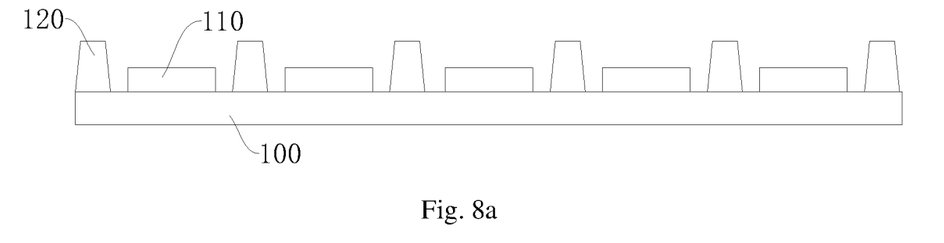
FIG. 8*a* to FIG. 8*i* are process diagrams of a display panel according to an embodiment of the present application.

In a first step, as shown in FIG. 8a, a backplate assembly is provided. The backplate assembly includes a driving backplate 100, a plurality of light sources 110 distributed on the driving backplate 100, and light shielding structures 120 are disposed surrounding the light sources 110.

Figure 8B:
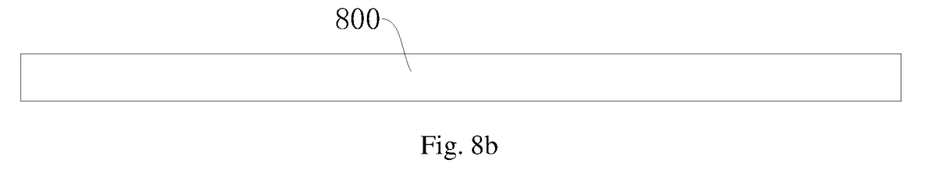

In a second step, as shown in FIG. 8b, a cover plate 800 is provided. The cover plate 800 is generally a glass cover plate 800, which has good hardness and can provide better protection.

Figure 8C:
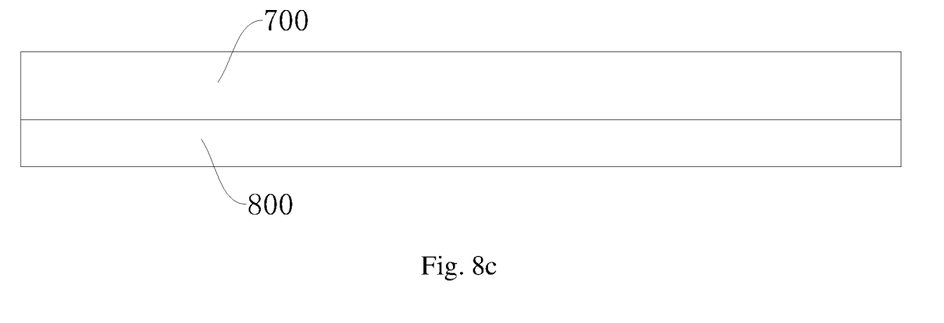

In a third step, as shown in FIG. 8c, a model layer 700 is formed on the cover plate 800. In order to ensure the light transmission effect, preferably, the model layer 700 is made of a transparent material.

Figure 8D:
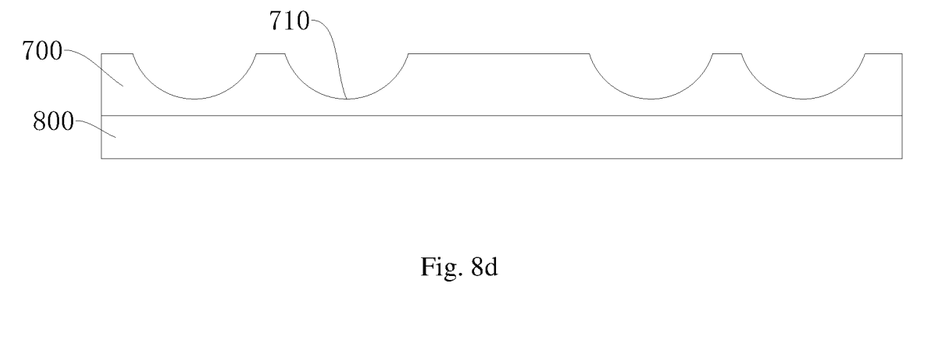

In a fourth step, as shown in FIG. 8d, recesses 710 are formed on the model layer 700, which can be formed by etching or other means.

Figure 8E:
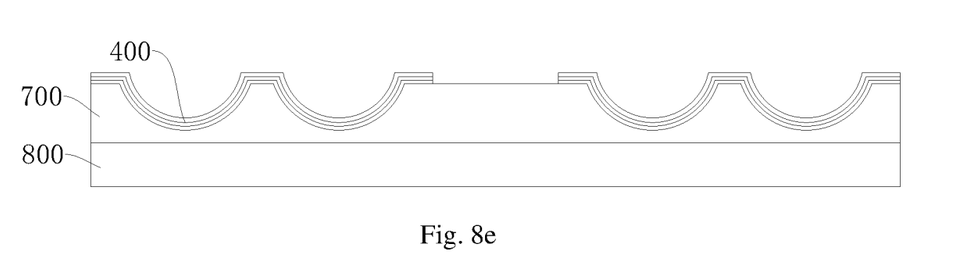

In a fifth step, as shown in FIG. 8e, a Bragg filter layer 400 is formed on the model layer 700, wherein curved optical filters 410 are formed on the Bragg filter layer 400 at the positions where the recesses 710 are located.

Figure 8F:
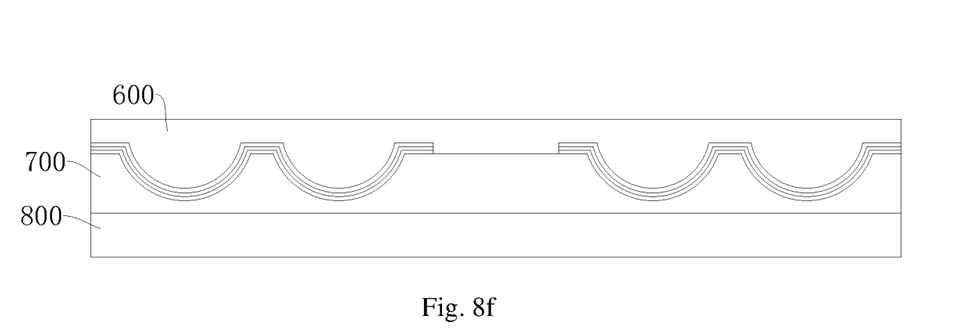

In a sixth step, as shown in FIG. 8f, a flattening layer 600 is formed on the Bragg filter layer 400. The flattening layer 600 may be made of the same material as or different material from the model layer 700. In order to ensure the light transmission effect, preferably, the flattening layer 600 is also made of a transparent material.

Figure 8G:
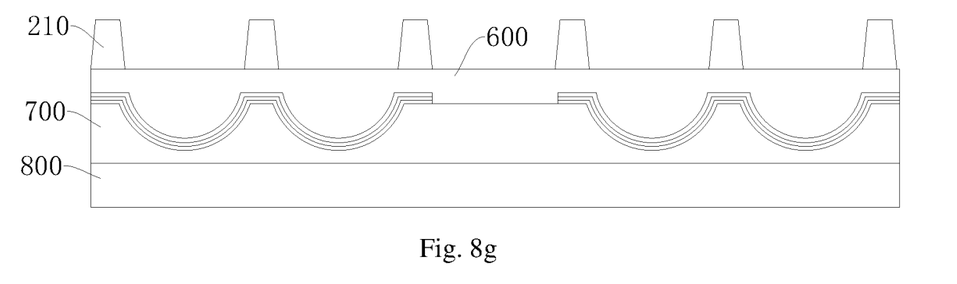

In a seventh step, as shown in FIG. 8g, isolation structures 210 are formed on the flattening layer 600, and the isolation structures 210 define accommodating spaces 211. The isolation structures 210 may be formed on the flattening layer 600 by evaporation or other patterning processes.

Figure 8H:
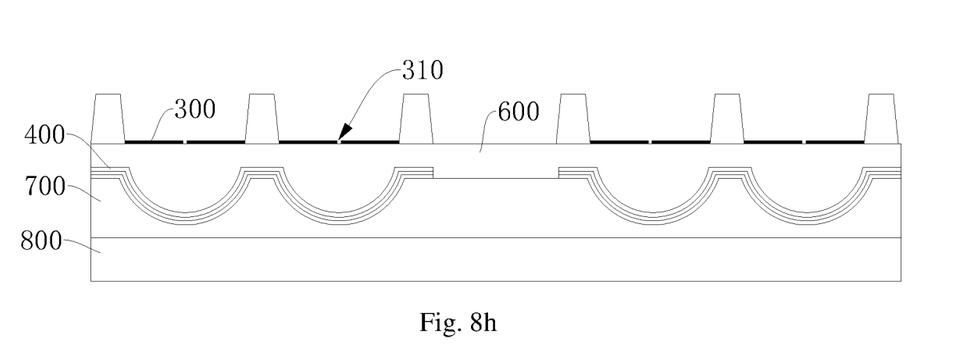

In an eighth step, as shown in FIG. 8h, baffles 300 are formed on the flattening layer 600 within the accommodating spaces 211. Each baffle 300 is provided with a light exit hole 310 which penetrates through the baffle 300.

Figure 8I:
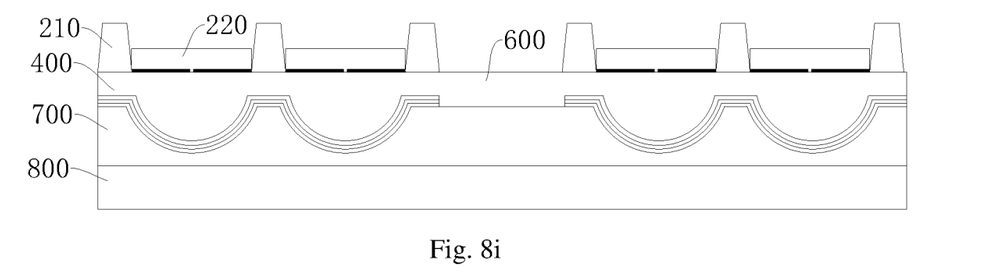

In a ninth step, as shown in FIG. 8i, light conversion units 220 are formed on the baffles 300 to form a color conversion assembly.

In a tenth step, the backplate assembly and the color conversion assembly are aligned and attached to each other, and are bonded together by use of adhesive glue or the like to form a display panel as shown in FIG. 6.

The present application can be implemented in other specific forms without departing from its application concept and essential characteristics. Therefore, the current embodiments are regarded as illustrative rather than limitative in all aspects, the scope of the present application is defined by the appended claims rather than the foregoing description, and all the modifications falling within the meaning and equivalents of the claims are included in the scope of the present application.

What is claimed is:

1. A color conversion assembly, comprising:
   a color conversion layer, comprising isolation structures, a plurality of accommodating spaces defined by the isolation structures, openings communicating with respective accommodating spaces, and light conversion units disposed in at least some of the accommodating spaces; and
   a Bragg filter layer, comprising curved optical filters disposed corresponding to the light conversion units and bending in a direction away from the light conversion units.

2. The color conversion assembly of claim 1, further comprising baffles disposed in the accommodating spaces and corresponding to the light conversion units, each baffle is connected to the isolation structures, the baffle is provided with a light exit hole which penetrates through the baffle, and an exit light passing through the light conversion unit exits through the light exit hole.

3. The color conversion assembly of claim 2, wherein a projection of the curved optical filter obtained by projecting the curved optical filter along a direction perpendicular to the paper direction is arc-shaped.

4. The color conversion assembly of claim 3, wherein the curved optical filter is formed as at least part of a hemisphere, and the center of the hemisphere is located in the light exit hole.

5. The color conversion assembly of claim 3, wherein the curved optical filter is formed as a hemisphere.

6. The color conversion assembly of claim 3, wherein adjacent two curved optical filters intersect.

7. The color conversion assembly of claim 3, wherein the curved optical filter is formed as a part of a hemisphere, and the curved optical filter and the baffle are spaced apart in a thickness direction of the color conversion assembly.

8. The color conversion assembly of claim 7, wherein a light blocking member is provided between adjacent two light exit holes, and the light blocking member is connected between the Bragg filter layer and the baffle or between the Bragg filter layer and the isolation structure.

9. The color conversion assembly of claim 2, wherein the material of the baffle comprises a reflective metal material and/or a light-absorbing material.

10. The color conversion assembly of claim 3, wherein the Bragg filter layer further comprises a flat portion for connecting adjacent two curved optical filters.

11. The color conversion assembly of claim 1, wherein the material of the isolation structure comprises a reflective metal material and/or a light-absorbing material.

12. The color conversion assembly of claim 1, wherein the isolation structure is provided with a reflective metal layer and/or a light-absorbing layer on its outer surface.

13. A display panel, comprising:
   a driving backplate, wherein a plurality of light sources are distributed on the driving backplate; and
   the color conversion assembly according to claim 1, wherein the light sources are disposed corresponding to the accommodating spaces.

14. The display panel of claim 13, wherein:
   the color conversion assembly further comprises baffles disposed in the accommodating spaces and corresponding to the light conversion units, each baffle is connected to the isolation structures, and is provided with a light exit hole which penetrates through the baffle, so that an exit light passing through the light conversion unit exits through the light exit hole; and
   the light source and the light exit hole are spaced apart in a thickness direction of the display panel, and along the thickness direction, the projection of the light source on the driving backplate and the projection of the light exit hole on the driving backplate are at least partially overlapped.

* * * * *